United States Patent
Dasgupta et al.

(10) Patent No.: US 7,332,971 B2
(45) Date of Patent: Feb. 19, 2008

(54) MULTI-GIGABIT/S TRANSIMPEDANCE AMPLIFIER FOR OPTICAL NETWORKS

(75) Inventors: Uday Dasgupta, Singapore (SG); Chun Geik Tan, Singapore (SG)

(73) Assignee: Agency for Science, Technology and Research, Singapore (SG)

(*) Notice: Subject to any disclaimer, the term of this patent is extended or adjusted under 35 U.S.C. 154(b) by 77 days.

(21) Appl. No.: 10/864,950

(22) Filed: Jun. 10, 2004

(65) Prior Publication Data

US 2005/0275466 A1    Dec. 15, 2005

(51) Int. Cl.
H03F 3/08       (2006.01)
H03F 1/36       (2006.01)

(52) U.S. Cl. .................. 330/308; 330/85; 330/110; 327/514

(58) Field of Classification Search ............... 330/308, 330/110, 85, 109; 327/514; 250/214 A, 250/206
See application file for complete search history.

(56) References Cited

U.S. PATENT DOCUMENTS

| | | | | |
|---|---|---|---|---|
| 4,498,001 A | 2/1985 | Smoot | ............... | 250/214 A |
| 4,872,209 A | 10/1989 | Blanken | ............... | 330/294 |
| 5,198,658 A | 3/1993 | Rydin | ............... | 250/214 A |
| 5,216,386 A | 6/1993 | Wyatt | ............... | 330/308 |
| 5,606,277 A | 2/1997 | Feliz | ............... | 327/311 |
| 6,084,478 A | 7/2000 | Mayampurath | ............... | 330/308 |
| 6,242,732 B1 | 6/2001 | Rantakari | ............... | 250/214 A |
| 6,275,114 B1 | 8/2001 | Tanji et al. | ............... | 330/308 |
| 6,462,327 B1 | 10/2002 | Ezell et al. | ............... | 250/214 A |
| 6,552,615 B1 | 4/2003 | Pavan et al. | ............... | 330/308 |
| 6,583,671 B2 | 6/2003 | Chatwin | ............... | 330/279 |
| 6,593,810 B2 | 7/2003 | Yoon | ............... | 330/69 |
| 6,611,174 B1 | 8/2003 | Sherman | ............... | 330/292 |
| 6,639,472 B2 | 10/2003 | Wilson et al. | ............... | 330/308 |
| 6,778,021 B2 * | 8/2004 | Denoyer et al. | ............... | 330/308 |

* cited by examiner

Primary Examiner—David Nelms
Assistant Examiner—David Y. Chung
(74) Attorney, Agent, or Firm—Saile Ackerman LLC; Stephen B. Ackerman

(57) ABSTRACT

A Gigabit/s transimpedance amplifier system includes a forward-path amplifier section with a very large bandwidth and an overall frequency-selective feedback section which is active only from DC to low frequencies. The forward-path of the amplifier comprises a regulated cascode for receiving the input signal, a regulated cascode for receiving the feedback signal, a single-ended to differential converter and an output buffer. Stability and frequency selection is achieved by a bandwidth-limited operational amplifier in the feedback path. The Miller multiplication of a capacitive means in the operational amplifier creates a low-frequency pole and stabilizes the feedback loop and thereby limits the frequency range of the feedback.

19 Claims, 4 Drawing Sheets

FIG. 1 – Prior Art

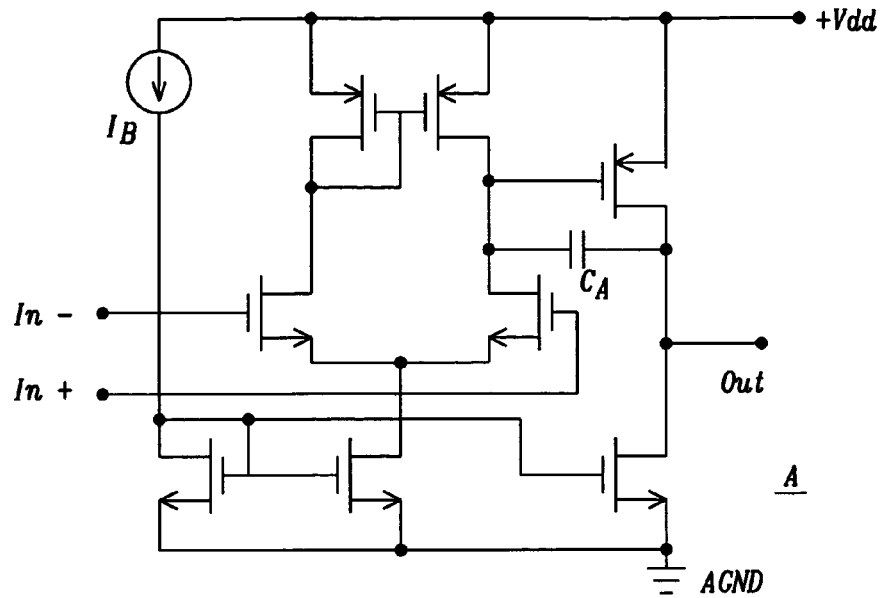
FIG. 3 – Prior Art
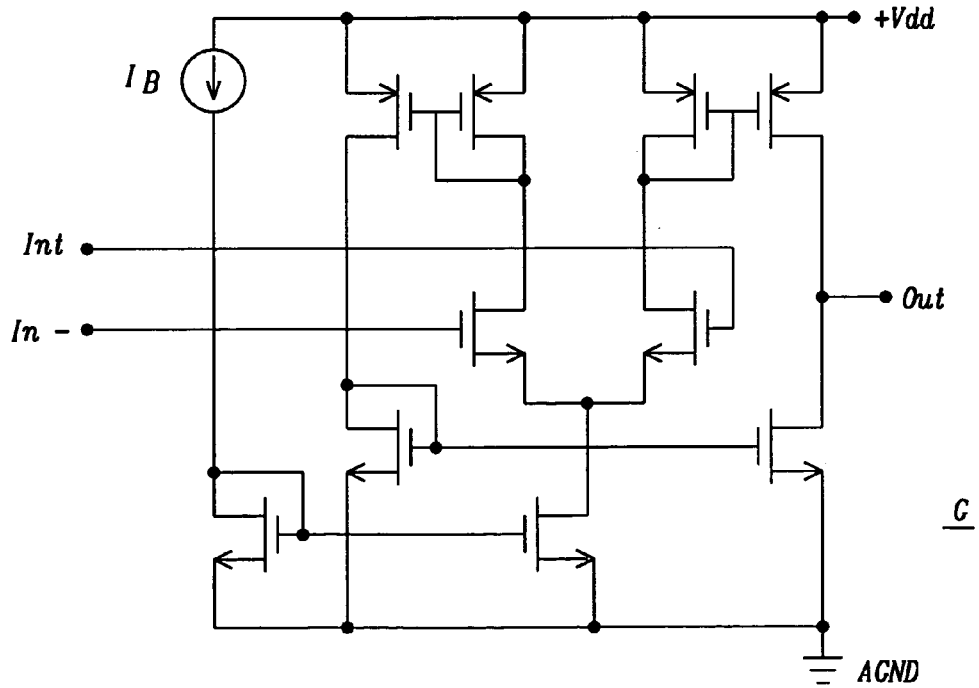
FIG. 4 – Prior Art

MULTI-GIGABIT/S TRANSIMPEDANCE AMPLIFIER FOR OPTICAL NETWORKS

BACKGROUND OF THE INVENTION

1. Field of the Invention

The invention relates to a very large bandwidth amplifier circuit, and more particularly to a transimpedance amplifier with a frequency-selective overall negative feedback active at DC and low frequencies only.

2. Description of the Related Art

Currently, optical networks are operating at several gigabits/s data rate. An important component of the optical network is the Transimpedance Amplifier (TIA). At the receiving end of the optical network, a photodiode is used to convert the optical pulses into electrical current pulses. The TIA picks up these current pulses, amplifies them and converts them into voltage pulses. At such high speeds, the conventional approach of designing TIA using overall wideband negative feedback suffers from bandwidth as well as stability problems. This is because to maintain stability with such feedback, some bandwidth has to be sacrificed, i.e., the bandwidth has to be intentionally narrowed. Additionally, while maintaining a wide bandwidth, the TIA must have low sensitivity to DC input currents and also the output must be DC offset free so as to directly couple to the next stage. To solve these DC problems, usually a large external capacitor is required. Therefore, such implementations are not suitable for high data rate designs.

The general scheme used in the prior art is shown in FIG. 1. It is basically a photodiode PD coupled between voltage supply $V_{DD}$ and the – input of a high frequency operational amplifier A. Amplifier A has an overall wide-band negative feedback using a resistor R. The resistor R determines the transimpedance gain of such a TIA. The inductor L, which can be external or a simulated internal one (requiring an external capacitor) provides the low-frequency roll-off. The signal OUT is the output of the operational amplifier A. The + input of amplifier A is coupled to a reference potential AGND (analog ground—usually $V_{DD}/2$).

Reference is made to U.S. Pat. No. 6,639,472 (Wilson et al.), U.S. Pat. No. 6,611,174 (Sherman), U.S. Pat. No. 6,552,615 (Pavan et al.), U.S. Pat. No. 6,593,810 (Yoon), U.S. Pat. No. 6,583,671 (Chatwin), U.S. Pat. No. 6,462,327 (Ezell et al.), U.S. Pat. No. 6,275,114 (Tanji et al.), U.S. Pat. No. 6,242,732 (Rantakari), U.S. Pat. No. 6,084,478 (Mayampurath), U.S. Pat. No. 5,606,277 (Feliz), U.S. Pat. No. 5,198,658 (Rydin), U.S. Pat. No. 5,216,386 (Wyatt), U.S. Pat. No. 4,498,001 (Smoot), and U.S. Pat. No. 4,872,209 (Blanken). The present invention is different from all above cited U.S. Patents.

Clearly a Multi-Gigabit/s transimpedance amplifier is desired with wide bandwidth, improved stability, low sensitivity to DC input currents and a DC offset free output. The present invention described hereinafter satisfies all these requirements.

SUMMARY OF THE INVENTION

It is an object of at least one embodiment of the present invention to provide an amplifier, and methods for producing such, for use in optical networks, capable of operating at Multi-Gigabit-per-second frequencies where the amplifier is stable at all conditions and minimizes inter-symbol interference.

It is another object of the present invention to provide the input of that amplifier with a low sensitivity to DC input currents and to have its output DC offset free.

It is yet another object of the present invention to provide correct DC bias and low input impedance at the input of that amplifier It is still another object of the present invention to provide the low-frequency roll-off without using any additional circuitry or external components.

It is a further object of the present invention is to provide a method and an amplifier suitable for high data rates.

It is yet a further object of the present invention is to suppress the effects of dark or ambient current from the input source.

These and many other objects have been achieved by an amplifier design with a forward-path amplifier section with a very large bandwidth and a feedback section which is frequency-selective and is active only from DC to low frequencies. The forward-path of the amplifier comprises a regulated cascode (transimpedance amplifier) for receiving the input signal, a regulated cascode for receiving the feedback signal, a single-ended to differential converter and an output buffer. Stability and frequency selection is achieved by capacitive means in the operational amplifier in the feedback path. The Miller multiplication of the capacitive means creates a low-frequency pole and stabilizes the feedback loop and limits the frequency range of the feedback signal from DC to low frequencies. Because the feedback loop is active at low frequencies the low-frequency roll-off reduces the DC gain and suppresses the dark current and ambient current. The transconductance amplifier of the feedback loop and the high gain of the operational amplifier suppresses DC offsets. Correct DC bias and a low input impedance is provided by the regulated cascode input circuit. Capacitive means in both regulated cascode circuits stabilize against ringing or self-oscillations insuring high data rates.

These and many other objects and advantages of the present invention will be readily apparent to one skilled in the art to which the invention pertains from a perusal of the claims, the appended drawings, and the following detailed description of the preferred embodiments.

BRIEF DESCRIPTION OF THE DRAWINGS

FIG. 3 is a circuit diagram of the operational amplifier of the prior art.

FIG. 4 is a circuit diagram of a transconductance amplifier of the prior art.

Use of the same reference number in different figures indicates similar or like elements.

DESCRIPTION OF THE PREFERRED EMBODIMENT

Figure 1:
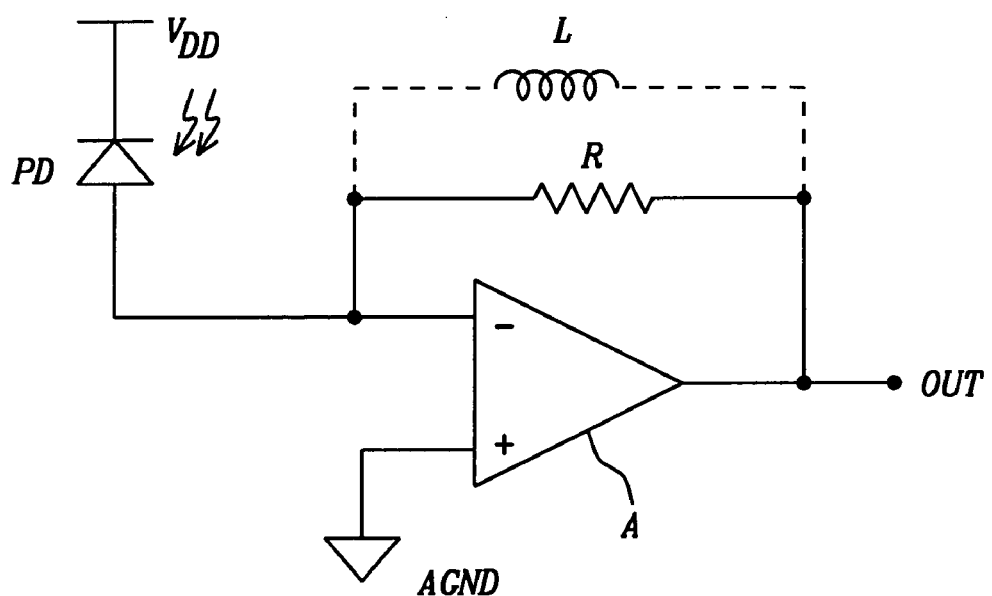
FIG. 1 is a schematic diagram of a transimpedance amplifier of the prior art.
Figure 2:
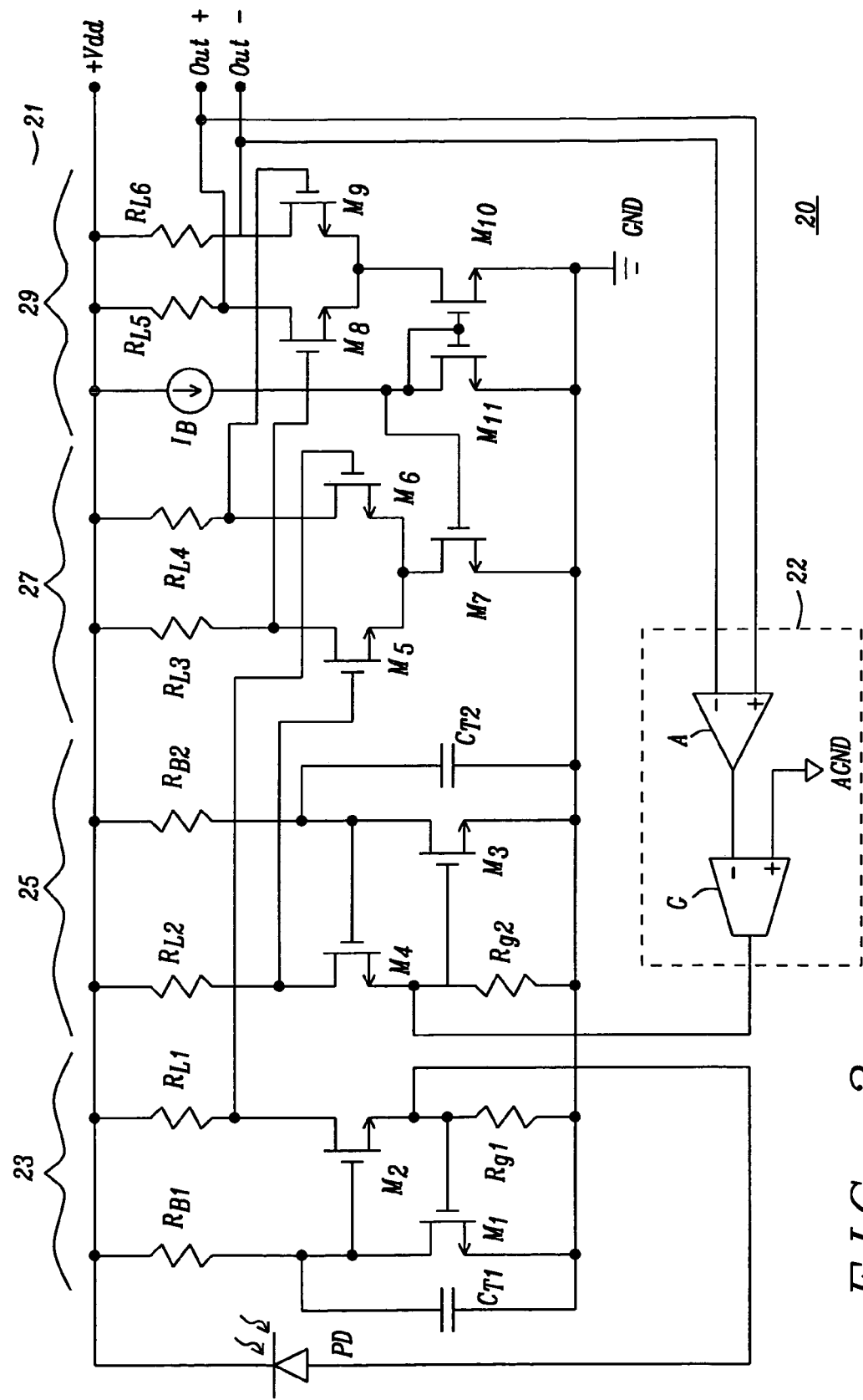
FIG. 2 is a circuit diagram of the preferred embodiment of the transimpedance amplifier of the present invention.

The present invention provides a very successful solution of the problem outlined above by not applying an overall wide-band negative feedback, but by applying a frequency-selective overall negative feedback, which is active at DC and low frequencies only. Referring now to FIG. 2, we describe the preferred embodiment of the present invention at the level of a block diagram. Transimpedance amplifier (TIA) 20 comprises amplifier section 21 and feedback section 22. Amplifier section 21 comprises a first regulated cascode 23 receiving its input from a photodiode (typical), a second regulated cascode 25 with a feedback input, a first amplifier stage 27, and a second amplifier stage 29 for buffering with outputs OUT+ and OUT−. Outputs of regulated cascodes 23 and 25 couple to the inputs of the single-ended to differential amplifier 27, the outputs of 27, couple to the inputs of the differential amplifier buffer 29. Feedback section 22, coupled between the inputs and outputs of amplifier section 21, comprises operational amplifier A and transconductance amplifier G. The inputs of operational amplifier A are coupled to the outputs of differential amplifier buffer 29. The output of operational amplifier A is coupled to transconductance amplifier G, its output is coupled back to the feedback input of the second regulated cascode 25.

Still referring to FIG. 2, we describe the circuit in more detail. Switching means $M_1$ and $M_2$ with resistive means $R_{B1}$ and $R_{G1}$ form the first regulated cascode 23. $R_{L1}$ is the load of this circuit. $M_3$, $M_4$, $R_{B2}$, $R_{G2}$ and $R_{L2}$ form the second identical circuit 25. The first regulated cascode 23 provides the correct DC bias and low input impedance at its input so as to take in the current from the photodiode PD. This input, the PD input, is at the junction of switching means $M_2$, resistive means $R_{G1}$, and the gate of switching means $M_1$. Two wavy arrows indicate light falling on PD. The circuit passes the photodiode current to its load $R_{L1}$ where it is converted into a voltage. $C_{T1}$ and $C_{T2}$ are capacitive means to stabilize the regulated cascode circuits against possible ringing or even self-oscillations. The TIA 20 is coupled between voltage supply VDD and a reference potential, typically ground (GND).

This voltage is further amplified by the two differential amplifier stages 27 and 29. The first amplifier stage 27 is formed by $M_5$, $M_6$, $M_7$, $R_{L3}$ and $R_{L4}$, and the following second amplifier stage 29 by $M_8$, $M_9$, $M_{10}$, $R_{L5}$ and $R_{L6}$. The bias current $I_B$ and $M_{11}$ provides the necessary bias voltage to both $M_7$ and $M_{10}$. The two stages also help to perform single-ended to differential conversion since the signal from PD develops only across $R_{L1}$, whereas there is no signal across $R_{L2}$. $R_{L5}$ and $R_{L6}$ are 50Ω each in order to match the external 50Ω loads. It is obvious that, numerically, $R_{B1}=R_{B2}$, $R_{G1}=R_{G2}$, $R_{L1}=R_{L2}$, $R_{L3}=R_{L4}$, $R_{L5}=R_{L6}$ and all differential devices are identical.

Again referring to FIG. 2, an overall negative feed back is applied from the outputs of TIA 20 through an operational amplifier A and a transconductance amplifier G back to the input of the second regulated cascode 25. This input, also called feedback input, is at the junction of switching means $M_4$, resistive means $R_{G2}$, and the gate of switching means $M_3$. Operational amplifier A provides a large DC voltage gain and transconductance amplifier G converts the voltage from operational amplifier A into a current. However, unlike the TIAs of the related art, this feed back is not a broad-band one. It is effective only at low frequency; the frequency selection being done by capacitive means $C_A$ in the operational amplifier A. Miller multiplication of this capacitive means creates a low-frequency pole. This pole stabilizes the feedback loop and also limits the frequency range of the feedback signal.

The circuit of prior art operational amplifier A, shown in FIG. 3, has inputs In− and In+ and output Out. A current source $I_B$ provides current for a current mirror. Capacitive means $C_A$, discussed above, is coupled between output Out and the load side of the In+ input switching means. The circuit of prior art transconductance amplifier G, shown in FIG. 4, has inputs In−, In+, output Out, and a current source $I_B$ to provide current for a current mirror. Both operational amplifier A and transconductance amplifier G are coupled between a voltage supply VDD and AGND (analog ground—usually $V_{DD}/2$).

The feedback loop, being active at low frequencies, reduces the DC gain of the TIA 20. In other words, it adds a low-frequency roll-off to the otherwise flat-to-DC response of the TIA. This is essential to suppress the effects of dark current/ambient current from the photodiode PD. However, it is also important to maintain as wide a bandwidth as possible (at both low and high frequency) to minimize inter-symbol interference (ISI) of the signal pulses through the TIA. The feedback loop also helps to suppress DC offsets, due to device mismatches, appearing at the outputs. This is possible since operational amplifier A has a high DC gain and this helps to maintain its inputs (TIA outputs) at almost identical DC potentials. Additionally, with the inactive terminal of transconductance amplifier G being returned to AGND, the output of operational amplifier A will be close to the same potential, i.e., analog ground. The output of transconductance amplifier G is at the DC potential provided by the input of the second regulated cascode 25. These ensure that both operational amplifier A and transconductance amplifier G work in the desired linear range of operation.

The inventive circuit 20 takes care of the DC problems without an external capacitor because of the Miller multiplication of $C_A$, which can be integrated and can still provide a low enough low-frequency roll-off. The mathematical analysis of the low frequency response of the TIA is given below, assuming A(s) is the frequency dependent voltage gain of the operational amplifier A and $G_0$ is the transconductance of the transconductance amplifier G.

The open-loop (forward path) transimpedance gain of the TIA is given by:

$$R_0 = R_{L1} g_{m5} R_{L3} g_{m8} R_{L5} \quad (1)$$

The loop gain, with the help of (1), is given by:

$$A_l(s) = A(s) G_0 R_{L1} g_{m5} R_{L3} g_{m8} R_{L5} = A(s) G_0 R_0 \quad (2)$$

Then, the closed-loop transimpedance gain of the TIA is given by:

$$R_f(s) = \frac{R_0}{1 + A_l(s)} \quad (3)$$

The response of the operational amplifier A can be expressed in terms of its DC gain $A_0$ and a single pole $\omega_p$ created by $C_A$, Miller multiplied by the gain of the second stage in conjunction with the output resistance of the first stage (FIG. 3) such that:

$$A(s) = \frac{A_0}{\frac{s}{\omega_p} + 1} \quad (4)$$

Combining (2) to (4) we have the final expression for the closed-loop transimpedance gain of the TIA 20:

$$R_f(s) = \frac{R_0\left(\frac{s}{\omega_p} + 1\right)}{\frac{s}{\omega_p} + A_0 G_0 R_0 + 1} \quad (5)$$

It can be seen from (5) that provided all other poles are at much higher frequencies, the transfer function has a single dominant pole and, therefore, is stable. The closed-loop DC transimpedance gain is given by:

$$R_f(0) = \frac{R_0}{1 + A_0 G_0 R_0} \cong \frac{1}{A_0 G_0} \text{ for } A_0 G_0 R_0 \gg 1 \quad (6)$$

Figure 5:
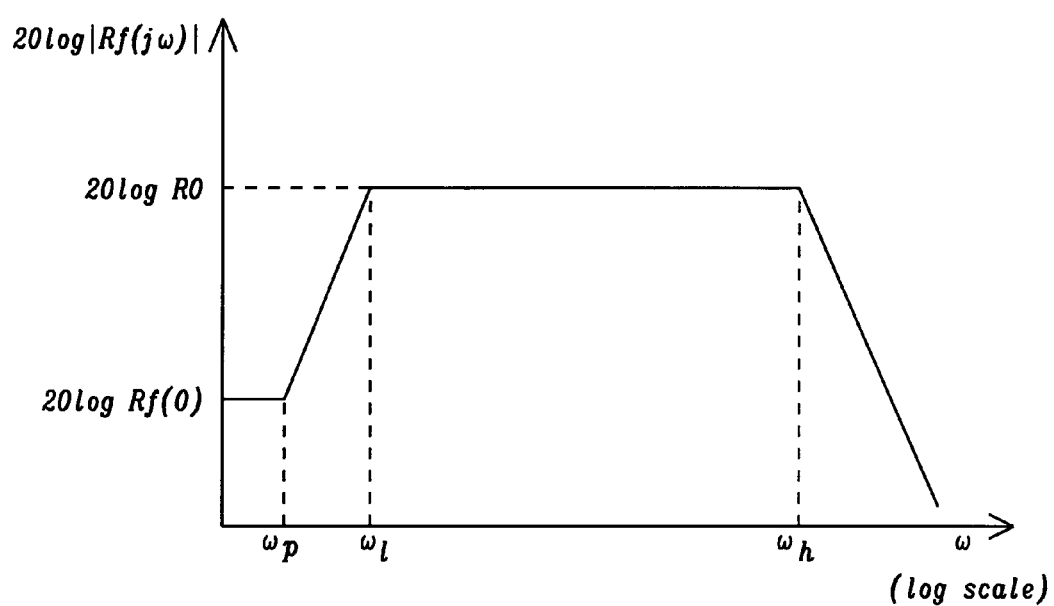
FIG. 5 illustrates the frequency response of the transimpedance gain of the transimpedance amplifier of FIG. 2.

It can be observed from (5) that the frequency response has a high-pass characteristic with the high frequency gain approaching $R_0$. This is shown in FIG. 5 with the addition of the high frequency roll-off at $\omega_h$ which has been neglected in the analysis. In FIG. 5 the X axis is the logarithmic scale of the frequency, the Y axis is the transimpedance gain of the TIA 20 of FIG. 2. Also, from (6) and (1), we can see that the DC transimpedance gain can be lowered considerably compared to $R_0$ by adjusting $A_0 G_0$.

The low-frequency roll-off frequency of the TIA is given by:

$$\omega_l = (1 + A_0 G_0 R_0)\omega_p \quad (7)$$

Let the output resistances and the transconductances of the first and second stages of the operational amplifier A be $r_{o1}$, $r_{o2}$, $g_{m1}$ and $g_{m2}$ respectively, then:

$$\omega_p = \frac{1}{r_{o1} g_{m2} r_{o2} C_A} \text{ and } A_0 = g_{m1} r_{o1} g_{m2} r_{o2} \quad (8)$$

Combining (7) with (8) we have:

$$\omega_l \cong G_0 R_0 \left(\frac{g_{m1}}{C_A}\right) \text{ for } A_0 G_0 R_0 \gg 1 \quad (9)$$

We can see that (9) suggests the use of low values of $G_0$ and $g_{m1}$ in order to maintain a low enough roll-off frequency $\omega_l$. Keeping this constraint in mind, it can be seen from (6) that, to meet the other DC requirements, $A_0$ has to be kept high. In spite of the above mentioned constraint, this can still be done by maintaining high values for $r_{o1}$ and $g_{m2} r_{o2}$.

The MOS transistors shown in the circuit configuration of FIG. 2 are directly replaceable with Bipolar ones. The gains $g_{m5} R_{L3}$ and $g_{m8} R_{L5}$ can be compensated for process/temperature variations by modulating the bias current $I_B$. Such schemes are well known to those skilled in the art. One such scheme is U.S. Pat. No. 6,529,077 (Dasgupta) by the first inventor and incorporated herein by reference. Therefore, the transimpedance gain of the inventive TIA is also stable against process/temperature variation without using a wideband overall feedback.

Numerical Data

Primary Parameters (Determined by Design and Specifications):

| | |
|---|---|
| AC transimpedance gain | $R_0 = 1000 \, \Omega$ |
| Op. Amp. DC gain | $A_0 = 10{,}000$ |
| Unity gain frequency of op. Amp. | $f_0 = \frac{1}{2\pi} \frac{g_{m1}}{C_A} = 100 \text{ kHz}$ |
| Feedback transconductance | $G_0 = 10^{-4} \text{ S}$ |

Secondary Parameters (Calculated/Simulated/Measured):

| | |
|---|---|
| DC transimpedance gain | $R_f(0) = \frac{1}{A_0 G_0} = 1 \, \Omega$ |
| Low frequency roll off at: | $f_1 = \frac{\omega_1}{2\pi} = \frac{1}{2\pi} G_0 R_0 \left(\frac{g_{m1}}{C_A}\right) = 10 \text{ kHz}$ |

The method of providing a multi-Gigabit/s amplifier for optical networks comprises the following steps:

a) providing a first amplifier for receiving a current from a photodiode;
b) providing a second amplifier for receiving a feedback input;
c) coupling the output of the first and second amplifier to a differential amplifier stage;
d) coupling a frequency-selective negative feedback path which is active only from DC to a break frequency between the output of the differential amplifier stage and the feedback input;
e) providing frequency selection in the feedback path with a bandwidth limited operational amplifier using Miller multiplication;
f) coupling a transconductance amplifier between the operational amplifier and the feedback input to convert the amplifier output into a current.

Advantages

1) The amplifier can have a very large bandwidth which is limited only by the process technology.
2) The DC conditions at the output can maintained in order.
3) The low-frequency roll-off can be achieved without using any additional circuitry or external components.
4) The transimpedance gain can be stabilized against process/temperature/power supply variations.
5) Stability of the feedback loop is maintained by restriction of the feedback signal bandwidth instead of restriction of the forward-path bandwidth.

While the invention has been particularly shown and described with reference to the preferred embodiments thereof, it will be understood by those skilled in the art that various changes in form and details may be made without departing from the spirit and scope of the invention.

What is claimed is:

1. A multi-Gigabit/s amplifier for optical networks, comprising:
an amplifier having a large bandwidth for picking up current pulses from a photodiode and converting and amplifying said current pulses into voltage pulses, said amplifier further comprising;

a first amplifier circuit having an input, connected to said photodiode, for receiving said current pulses and producing a voltage signal at a first single-ended output;

a second amplifier circuit having a feedback input for feedback summing and producing a voltage signal at a second single ended output;

a single-ended to differential converter coupled to said first and second single ended output of said first and said second amplifier circuit, said single-ended to differential converter providing a differential output;

an output driver coupled to said single-ended to differential converter, said output driver matching a load impedance; and frequency-selective negative feedback applied to said feedback input of said second amplifier, where said frequency-selective negative feedback is active only from DC to a break frequency to limit the frequency range of said feedback, said frequency-selective negative feedback further comprising:

a bandwidth-limited operational amplifier using Miller multiplication for bandwidth restriction of said feedback; and a transconductance amplifier coupled between said operational amplifier and said feedback input of said second amplifier, said transconductance amplifier converting the output of said operational amplifier into current for feedback summing.

2. The multi-Gigabit/s amplifier of claim 1, wherein said Miller multiplication uses on-chip capacitive means for providing capacitance for bandwidth restriction of said feedback.

3. The multi-Gigabit/s amplifier of claim 2, wherein said capacitive means is coupled between the positive input and the output of said operational amplifier.

4. The multi-Gigabit/s amplifier of claim 1, wherein the output of said transconductance amplifier is held at the DC potential provided by said feedback input of said second amplifier circuit.

5. A multi-Gigabit/s amplifier for optical networks, comprising:

an amplifier having a large bandwidth for picking up current pulses from a photodiode and converting and amplifying said current pulses into voltage pulses, said amplifier further comprising;

a first regulated cascode circuit, with an input, connected to said photodiode, and a first output, to provide a DC bias and input impedance suitable for said current pulses at said input and to provide a voltage signal at said first output;

a second regulated cascode circuit, with a feedback input and a second output, to receive a summing feedback signal at said feedback input and to provide a voltage signal at said second output;

a first differential amplifying stage, with inputs and outputs, coupled to said first and said second regulated cascode circuit output, said first differential amplifying stage performing single-ended to differential signal conversion;

a second differential amplifying stage, with inputs and outputs, coupled to said outputs of said first differential amplifying stage, said second differential amplifying stage performing output load matching; and frequency-selective negative feedback applied to said feedback input of said second regulated cascode circuit, where said frequency-selective negative feedback reduces the DC gain of said amplifier to suppress the effects of dark and ambient currents applied by said photodiode to said photodiode input of said first regulated cascode circuit, said frequency-selective negative feedback further comprising:

a bandwidth-limited operational amplifier with inputs and an output, said inputs coupled to said outputs of said second differential amplifying stage, said bandwidth-limited operational amplifier using Miller multiplication to set a break frequency; and a transconductance amplifier having a negative and a positive input and an output, where said negative input is coupled to said output of said operational amplifier and where said output of said transconductance amplifier is coupled to said feedback input of said second regulated cascode circuit, said transconductance amplifier converting the output of said operational amplifier into current for feedback summing.

6. The multi-Gigabit/s amplifier of claim 5, wherein said frequency-selective negative feedback is active only from DC to said break frequency to limit the frequency range of said feedback.

7. The multi-Gigabit/s amplifier of claim 5, wherein said Miller multiplication uses on-chip capacitive means for providing capacitance to limit the frequency range of said feedback signal.

8. The multi-Gigabit/s amplifier of claim 7, wherein said capacitive means is coupled between the positive input and said output of said operational amplifier.

9. The multi-Gigabit/s amplifier of claim 5, wherein said positive input of said transconductance amplifier is coupled to a reference potential.

10. The multi-Gigabit/s amplifier of claim 5, wherein the positive output of said second differential amplifying stage is coupled to the positive input of said operational amplifier, and wherein the negative output of said second differential amplifying stage is coupled to the negative input of said operational amplifier.

11. The multi-Gigabit/s amplifier of claim 5, wherein said output of said transconductance amplifier is held at the DC potential provided by said feedback input of said second regulated cascode circuit.

12. The multi-Gigabit/s amplifier of claim 5, wherein said first regulated cascode circuit comprises capacitive means for providing a capacitance to stabilize said first regulated cascode circuit against oscillations.

13. The multi-Gigabit/s amplifier of claim 5, wherein said second regulated cascode circuit comprises capacitive means for providing a capacitance to stabilize said second regulated cascode circuit against oscillations.

14. The multi-Gigabit/s amplifier of claim 5, wherein switching means of said amplifier and said frequency-selective negative feedback are metal-oxide devices.

15. The multi-Gigabit/s amplifier of claim 5, wherein switching means of said amplifier and said frequency-selective negative feedback are bipolar devices.

16. A method of providing a multi-Gigabit/s amplifier for optical networks, composing the steps of:

a) providing a first amplifier with a photodiode input for receiving a current from a photodiode;

b) providing a second amplifier with a feedback input for receiving a feedback from a feedback path;

c) coupling the output of the first and second amplifier to a differential amplifier stage;
d) coupling a frequency-selective negative feedback path which is active only from DC to a break frequency between the output of the differential amplifier stage and the feedback input;
e) providing frequency selection in the feedback path with a bandwidth limited operational amplifier using Miller multiplication; and
f) coupling a transconductance amplifier between the operational amplifier and the feedback input to convert the amplifier output into a current.

17. The method of providing a multi-Gigabit/s amplifier of claim 16, wherein said Miller multiplication uses an on-chip capacitance.

18. The method of providing a multi-Gigabit/s amplifier of claim 16, wherein a buffer is coupled after the differential amplifier stage.

19. The method of providing a multi-Gigabit/s amplifier of claim 16, wherein the stability of the feedback loop is maintained by restricting the feedback signal bandwidth.

* * * * *